United States Patent
Da Rocha Mordente et al.

(10) Patent No.: US 9,777,239 B2
(45) Date of Patent: Oct. 3, 2017

(54) ELEMENT COMPRISING AT LEAST ONE SLIDING SURFACE HAVING A COATING FOR USE IN AN INTERNAL COMBUSTION ENGINE OR A COMPRESSOR

(75) Inventors: Paulo Jose Da Rocha Mordente, Jundiai (BR); Robert R. Banfield, Sao Paulo (BR); Jose V. Sarabanda, Sao Paulo (BR)

(73) Assignees: MAHLE Metal Leve S.A., Jundiai—SP (BR); MAHLE International GmbH, Stuttgart (DE)

( * ) Notice: Subject to any disclaimer, the term of this patent is extended or adjusted under 35 U.S.C. 154(b) by 27 days.

(21) Appl. No.: 14/123,002

(22) PCT Filed: May 28, 2012

(86) PCT No.: PCT/BR2012/000160
§ 371 (c)(1),
(2), (4) Date: May 23, 2014

(87) PCT Pub. No.: WO2012/162771
PCT Pub. Date: Dec. 6, 2012

(65) Prior Publication Data
US 2014/0323367 A1    Oct. 30, 2014

(30) Foreign Application Priority Data
May 27, 2011  (BR) .................................... 1102335

(51) Int. Cl.
*C23C 14/06*    (2006.01)
*C10M 103/06*    (2006.01)
(Continued)

(52) U.S. Cl.
CPC ....... *C10M 103/06* (2013.01); *C23C 14/0641* (2013.01); *C23C 14/3485* (2013.01); *C23C 30/00* (2013.01); *F02B 77/02* (2013.01)

(58) Field of Classification Search
USPC ........ 277/440, 442; 428/336, 469, 472, 698; 204/192, 192.15, 192.16
See application file for complete search history.

(56) References Cited

U.S. PATENT DOCUMENTS 5,449,547 A    9/1995  Miyazaki et al.
5,601,293 A    2/1997  Fukutome et al.
(Continued)

FOREIGN PATENT DOCUMENTS

BR    1102335 A2    6/2013
CN    103930587     6/2013
(Continued)

OTHER PUBLICATIONS

Greczynski et al "Microstructure control of CrNx films during high power impulse magnetron sputtering" Suface & Coating Tech. 205 (2010) p. 118-130.*
(Continued)

*Primary Examiner* — Archene Turner
(74) *Attorney, Agent, or Firm* — Alston & Bird LLP

(57) ABSTRACT

An element with at least one slide surface with a coating for use on an internal combustion engine may include a base of a metallic alloy and at least one inner surface provided with a hard ceramic coating generated by physical vapor deposition. The element may include a porosity with a rate lower than 2 percent by volume, a Vickers hardness ranging from 1500 to 3000HV, and a compressive inner tension lower than 500 MPa.

19 Claims, 2 Drawing Sheets

(51) Int. Cl.
     C23C 14/34    (2006.01)
     C23C 30/00    (2006.01)
     F02B 77/02    (2006.01)

(56) References Cited

U.S. PATENT DOCUMENTS

| | | | |
|---|---|---|---|
| 5,743,536 | A | 4/1998 | Komuro et al. |
| 5,851,659 | A * | 12/1998 | Komuro ............ C23C 14/0641 |
| | | | 428/698 |
| 5,960,762 | A | 10/1999 | Imai |
| 6,149,162 | A | 11/2000 | Tanaka et al. |
| 6,270,081 | B2 | 8/2001 | Onoda et al. |
| 6,372,369 | B1 | 4/2002 | Ito et al. |
| 8,173,278 | B2 * | 5/2012 | Cremer ............ C23C 14/0641 |
| | | | 204/192.15 |
| 8,597,797 | B2 * | 12/2013 | Sekiya ............... C23C 14/0036 |
| | | | 277/434 |
| 2008/0136116 | A1 * | 6/2008 | Sarabanda ........... C23C 14/025 |
| | | | 277/443 |
| 2008/0260478 | A1 | 10/2008 | Hovsepian et al. |
| 2009/0068450 | A1 * | 3/2009 | Muenz ............... C23C 14/0641 |
| | | | 428/457 |
| 2009/0278320 | A1 * | 11/2009 | Araujo ............... C23C 14/0036 |
| | | | 277/442 |
| 2010/0236919 | A1 | 9/2010 | Alami et al. |
| 2010/0295251 | A1 * | 11/2010 | Sekiya ............... C23C 14/0664 |
| | | | 277/443 |
| 2011/0180389 | A1 | 7/2011 | Cremer et al. |
| 2014/0127519 | A1 | 5/2014 | Lechthaler |

FOREIGN PATENT DOCUMENTS

| | | | |
|---|---|---|---|
| EP | 0707092 | A1 | 4/1996 |
| EP | 0884400 | A1 | 12/1998 |
| EP | 2162649 | B1 | 5/2012 |
| EP | 2716790 | B1 | 8/2015 |
| GB | 2450933 | * | 1/2009 |
| JP | H06288294 | A | 10/1994 |
| JP | H07224936 | A | 8/1995 |
| JP | H08312779 | A | 11/1996 |
| JP | 2005-060810 | A | 3/2005 |
| JP | 2005-187927 | A | 7/2005 |
| JP | 2006-002016 | A | 1/2006 |
| JP | 2007-132423 | A | 5/2007 |
| JP | 2007-278314 | A | 10/2007 |
| JP | 2009-133445 | A | 6/2009 |
| JP | 2010-031359 | A | 2/2010 |
| JP | 2011-518950 | A | 6/2011 |
| JP | 2014-517870 | A | 7/2014 |
| JP | 2014-523476 | A | 9/2014 |
| WO | WO 2007/147532 | A2 | 12/2007 |
| WO | WO-2011/000068 | A1 | 1/2011 |
| WO | WO 2012/162771 | A1 | 12/2012 |

OTHER PUBLICATIONS

Ehiasarian et al "Interface microstructure engineering by high power impulse magnetron sputtering for the enhancement of adhesion" Journ. of Applied Physics 101, 054301 (2007).*

Ehiasarian et a;l "Influence of high power impulse magnetron sputtering plasma ionization on the microstructure of TiN films" Journal of Applied Physics 109, 104314 (2011).*

Greczynski et al "Microstructure control of CrNx films during high power impulse magnetron sputtering" Surfcae & Coatings Tchn 205 (2010) pp. 118-130.*

Olaya et al "Influence of the ion-atom flux ratio on the mechanical properties of chromiun nitride thin films" Vacuum 81 (2007) pp. 610-618.*

Ehiasarian A P et al: "Comparison of 1,2,5,6, microstructure and mechanical properties 8 of chromium nitride-based coatings deposited by high power impulse magnetron sputtering and by the combined steered cathodic arc/unbalanced magnetron technique", Thin Solid Films, Elsevier-Sequoia S.A. Lausanne, CH, vol. 457, No. 2, Jun. 15, 2004, pp. 270-277, XP004507225, ISSN: 0040-6090, 001 : 10.1016/J.TSF.2003.11.113 p. 270—paragraph 1 p. 271, paragraph 2.1.1 p. 273; figure 4 p. 274, left-hand column—paragraph 1.

Sa Fra N G et al: "Influence of the bias voltage on the structure and mechanical performance of nanoscale multilayer CrAlYNa CrN physical vapor deposition coatings", Journal of Vacuum Science and Technology: Part A, AVS /AIP, Melville, NY., US, vol. 27, No. 2, Feb. 6, 2009, pp. 174-182, XP012128842, ISSN: 0734-2101, 001: 10.1116/1.3065675 p. 175, paragraph II.A. p. 179, paragraph C.I.; table II p. 180; figure 6.

Lin J et al: "High rate deposition of thick CrN and Cr2N coatings using modulated pulse power (MPP) magnetron sputtering", Surface and Coatings Technology, Elsevier, Amsterdam, NL, vol. 205, No. 10, Feb. 15, 2011, pp. 3226-3234, XP027586611, ISSN: 0257-8972, [retrieved on Jan. 6, 2011] p. 3226, right-hand column, last paragraph—p. 3227, left-hand column,paragraph 1 p. 3228; table 1 p. 3229, right-hand column, paragraph 2; figure 4.

Hovsepian P EH et al: "CrAlYN/CrN superlattice coatings deposited by the combined high power impulse magnetron sputtering/ unbalanced magnetron sputtering technique",Surface and Coatings Technology, Elsevier,Amsterdam, NL,vol. 201, No. 7,Dec. 20, 2006, pp. 4105-4110, XP024995947,ISSN: 0257-8972, 001: 10.1016/J.SURFCOAT.2006.08.027 [retrieved on Dec. 20, 2006] p. 4106, paragraph 2 p. 4107, paragraph 4.1.

Hovsepian P EH et al: "Novel TiAlCN/VCN nanoscale multilayer PVD coatings deposited by the combined high-power impulse magnetron puttering/unbalanced magnetron sputtering (HIPIMS/ UBM) technology", Vacuum, Pergamon Press, GB, vol. 82, No. II, Jun. 19, 2008, pp. 1312-1317, P022733461,ISSN: 0042-207X, 001: 10.1016/J.VACUUM.2008.03.064 [retrieved on Apr. 8, 2008] p. 1313, paragraph 2 p. 1314, paragraph 4.1.

Lin J et al: "The structure and properties of chromium nitride coatings deposited using dc, pulsed dc and modulated pulse power magnetron sputtering" Surface and Coatings Technology, Elsevier,Amsterdam, NL,vol. 204, No. 14,Apr. 15, 2010, pp. 2230-2239, XP026903379, ISSN: 0257-8972, 001: 10.1016/J. SURFCOAT.2009.12.013 [retrieved on Jan. 6, 2010] p. 2231, paragraph 2 p. 2232; table 1 p. 2233; table 2.

Boxman, R.L., et al., "Handbook of Vacuum Arc Science and Technology", 1995, pp. 471-472, Noyes Publications, U.S.A.

Ehiasarian, A.P., et al., "Comparison of microstructure and mechanical properties of chromium nitride-based coatings deposited by high power impulse magnetron sputtering and by the combined steered cathodic arc/unbalanced magnetron technique", *Thin Solid Films*, 2004, pp. 270-277, vol. 457, Elsevier, Netherlands.

European Patent Office, Communication of Further Notices of Opposition (R.79(2) EPC) for Application No. 12738384.2, Jun. 13, 2016, 1 pages, Germany.

European Patent Office, Communication of Notice of Opposition for Application No. 12738384.2, May 17, 2016, 1 pages, Germany.

European Patent Office, Communication of Notices of Opposition (R.79(1) EPC) for Application No. 12738384.2, Jun. 13, 2016, 1 pages, Germany.

European Patent Office, Decision to Grant a European Patent for Application No. 12738384.2, Jul. 9, 2015, 3 pages, Germany.

European Patent Office, Intention to Grant for Application No. 12738384.2, Apr. 16, 2015, 20 pages, Germany.

European Patent Office, Invitation to File a Copy of Search Results or Statement of Non-Availability pursuant to Rule 70b(1) EPC for Application No. 12738384.2, Sep. 10, 2014, 1 pages, Germany.

Federal-Mongul Burscheid Gmbh, Notice of Opposition for European Application No. 12738384.2, May 6, 2016, 70 pages, Germany.

Gautier, C., et al., "Study and elaboration of ternary chromium based compounds (Cr, O, N) deposited by vacuum arc evaporation", *Surface and Coatings Technology*, 1997, pp. 422-427, vol. 94-95, Elsevier Science, S.A., Switzerland.

Genzel, C., Et Al., "Depth-resolved X-ray residual stress analysis in PVD (Ti, Cr) N hard coatings", *Z. Matellkd.*, 2003, vol. 94, No. 6, Carl Hanser Verlag, Germany.

(56) References Cited

OTHER PUBLICATIONS

Hoche, H, et al., "Development of a plasma surface treatment for magnesium alloys to ensure sufficient wear and corrosion resistance", *Surface & Coatings Technology*, 2003m vol. 174-175, pp. 1018-1023, Elsevier, B.V., Netherlands.

International Preliminary Examining Authority, International Preliminary Report on Patentability for International Application No. PCT/BR2012/000160, Oct. 23, 2013, European Patent Office, Germany.

International Searching Authority, International Search and Written Opinion for International Application No. PCT/BR2012/000160, Oct. 5, 2012, 12 pages, European Patent Office, Netherlands.

Japan Patent Office, Notification of Reasons for Refusal for Application No. 2014-513007, Jan. 18, 2016, 4 pages, Japan.

Japan Patent Office, Search Report for Application No. 2014-513007, Dec. 24, 2015, 51 pages, Japan.

Mahle Metal Leve S/A and Mahle International GmbH, Applicant's Response to EPO's Sep. 10, 2014 Invitation to File a Copy of Search Results, Oct. 17, 2014, 81 pages, Germany.

Odén, M., et al., "Microstructure-property relationships in arc-evaporated Cr-N coatings", *Thin Solid Films*, 2000, vol. 377-378, pp. 407-412, Elsevier, S.A., Switzerland.

Papa, Frank, "Industrial Impact of HIPIMS and HIPIMS+ Technology", *Hauzer for You*, Jul., 2009, No. 15, pp. 12-16, Hauzer Techno-Coating, B.V., Netherlands.

Paulitsch, J. et al., "Structure and properties of high power impulse magnetron sputtering and DC magnetron sputtering CrN and TiN films deposited in an industrial scale unit", *Thin Solid Films*, Jun. 2010, pp. 5558-5564, vol. 518, Elsevier B.V., Netherlands.

\* cited by examiner

ELEMENT COMPRISING AT LEAST ONE SLIDING SURFACE HAVING A COATING FOR USE IN AN INTERNAL COMBUSTION ENGINE OR A COMPRESSOR

CROSS-REFERENCE TO RELATED APPLICATIONS

This application is a US national phase application of PCT/BR2012/000160, filed on May 28, 2012, which claims priority to Brazilian patent application PI1102335-0, filed on May 27, 2011, the contents of which are hereby incorporated by reference in their entirety.

TECHNICAL FIELD

The present invention relates to an element that works sliding on an internal combustion engine undergoes friction and that receives a chrome-based ceramic coating by physical deposition in the vapour phase, achieved by high power impulse magnetron plasma so as to wear through less internal tension, high hardness and low porosity.

BACKGROUND

Internal combustion engine comprise numberless elements that undergo friction and, as a result, undergo wear because they are subjected to severe stresses when the engine is operating.

One of the ways to guarantee resistance to wear for an element that works sliding so that it can have long/sufficient useful life for the useful-life parameters of the engine is the application of one or more layers of coating on the base metal from which it is built. The coating, developed specifically for resisting wear and abrasion, maintains the performance properties of the element that works sliding, even after millions of explosion cycles of the engine.

Besides cylinders, pistons and panels, an internal combustion engine has a number of additional elements provided with at least one slide surface, which can receive coatings so as to prolong the useful life of the piece. Some of these elements are bearings, components of the valve gear (tappets, camshafts, lobes, etc.).

In this regard, there are numberless techniques using the most varied compositions of coatings and numberless application processes, each trying to optimize the performance and durability properties of the most varied types and configurations of elements for use on an internal combustion engine having a slide surface.

The most relevant prior-art coatings to the present invention are the ceramic coatings composed of nitrides generated through a physical-deposition process in the vapor phase (physical vapor deposition), called herein PVD.

Nitride coatings formed through PVD processes exhibit inner tensions that increase as a function of the thickness of the layer (see FIG. 1). These tensions are typically compressive and become more compressive as the film grows.

FIG. 1 presents a graph that evidences the increase in compressive inner tension in a chrome-nitride (CrN) coating deposited at 450° C. and with a tension of acceleration of particles against the substrate of 175V, this coating having been obtained by the sputtering deposition of a material onto the target surface.

This phenomenon of increase in the compressive inner tension as a function of the growth of the coating is due to the fact that in the plasma environment the positive ions are attracted by an electric and magnetic field to the surface on which the coating grows, so that the energy of bombing ions onto the coating induces the generation of compressive tensions in the films.

Moreover, nitride films are crown in an environment that generally involves a few hundreds of degrees centigrade, wherein, after deposition of the coating onto the substrate, the film is cooled and, as a result, the existence of different dilatation coefficients promotes greater contraction of the substrate. Thus, different dilatation between the coating material and substrate material promotes the "formation" of compressive inner tensions in the nitride films.

The existence of such compressive inner tensions brings various drawbacks, limiting, on the one hand, the coating thickness and decreasing, on the other hand, the work load that such elements provided with coating may bear. It should be noted that, since the inner tensions are compressive, they add to the loading values to which the elements are subject.

As a result, every coating, upon being stressed by an external loading (due to the application as a component of a machine or an internal combustion engine, for example), will be subjected to the generation of tensions due to the loading and then the closer to the neutral value (or null inner tension) the initial tension of the coating is, the greater the loading which the latter bears will be, until it reaches a tension that causes rupture of the coating (crack nucleation and growth thereof). When the values of the compressive inner tension and of loading exceed the limit values which the coating can receive, there is a displacement of the coating, which may cause severe damages to the coating.

With regard to coating growth, one observes that some coatings, for example, TiN, exhibit limitation in the growth due to the high tension thereof and, as a result, it is not possible to grow the coating to thicknesses higher than 2 or 3 micrometers ($\mu m$).

Another condition that also affects the resistance of the films is the presence of pores. Pores are regions present in the coating, which have defect due to the extremely low localized cohesion of the material. Thus, the pores act as tension concentrators in greater or lesser scale, depending on the geometry and number of pores. Naturally, a high porosity rate impairs the resistance of a coating to wear.

In this context, the present-day model in nitrided ceramic coatings is reflected by the following ratio between the variables that interact in the coating. A larger thickness of layer will generate higher inner compression tension, which aggravates with the porosity rate of the coating. This ratio ends up limiting the values of hardness and the consequent resistance to wear of the solutions indicated by the prior art.

An example of this are documents U.S. Pat. No. 5,449,547 and U.S. Pat. No. 6,270,081, which describe piston rings provided with CrCN/CrON and CrN coatings, respectively. It should be noted that the hardness of these coatings is limited to 2200 HV and 1800 HV, respectively, the second document mentioning porosity rates higher than 3%.

In turn, document U.S. Pat. No. 6,372,369 discloses coatings for piston rings made of CrN and TiN with hardness that ranges from 1300 to 2300 HV. It should be noted that the hardness value is hardly higher than 200 HV when dealing with nitrided mono-layer coatings, this hardness ceiling being one of the limitations resulting from the model relationship existing for this type of coatings.

Unfortunately, present-day coatings of elements that work sliding do not exhibit an adequate performance of resistance to wear when stressed at severe working conditions. Such reality indicates that present-day PVD coatings will not work correctly in the next few generations of engines, especially on engines having exhaust gas recirculation—

EGR—and selective catalytic reduction—SCR, and these engines will be used in future generations with a view to reduce the pollutant emission rates.

Thus, the conventional methods presented in the prior art do not disclose a technical solution that will enable one to obtain a nitrided ceramic coating with high properties, which simultaneously presents the possibility of causing a film to grow, while keeping the compressive inner tensions reduced, capable of enabling an extraordinary resistance to wear.

SUMMARY

The present invention has the objective of providing an element that works sliding for use on an internal combustion engine, provided with a nitride-based coating that is capable of providing an increase in the resistance to wear.

The present invention has also the objective of providing an element that works sliding with a nitride-based coating that enables an increase in its thickness without raising the compressive inner tensions, simultaneously with a very reduced porosity rate.

The objectives of the present invention are achieved by means of an element provided with at least one slide surface for use on an internal combustion engine, the element comprising a base of a metallic alloy and at least one outer surface provided with a hard ceramic coating generated by physical vapour deposition (PVD), wherein the element comprises porosity with a rate lower than 2% by volume, Vickers hardness ranging from 1500 to 3000 HV and compressive inner tension lower than 500 MPa.

BRIEF DESCRIPTION OF THE DRAWINGS

The present invention will now be described in greater detail with reference to an example of embodiment represented in the drawings. The figures show.

DETAILED DESCRIPTION

The present invention relates to the innovatory possibility of dominating the inner tensions of a coating regardless of its thickness, thus enabling one to carry out coatings with thicknesses larger than the conventional ones and to increase the resistance to wear of such ceramic coatings nitrided with the physical vapour deposition (PVD) process.

The properties of a coating deposited by the physical vapour deposition vary much as a function of the energy applied to the positive ions, for example, $Cr^+$ and $N^+$, during the deposition process.

As discussed before, present-day processes of nitrided ceramic coating on elements 1 that works sliding on internal combustion engines exhibit limitations with regard to the tribological performance because of their high compressive inner tension.

The present invention provides a solution to this problem by promoting the growth of a coating 4 without increasing the compressive inner tension of the coating 4.

It should be noted that the elements 1 that work sliding may comprise various components of an engine that undergo contact, a friction relationship resulting between them. Thus, the coating 4 of the present invention can be applied to one of two elements or simultaneously to both elements that will interact with each other.

Figure 3:
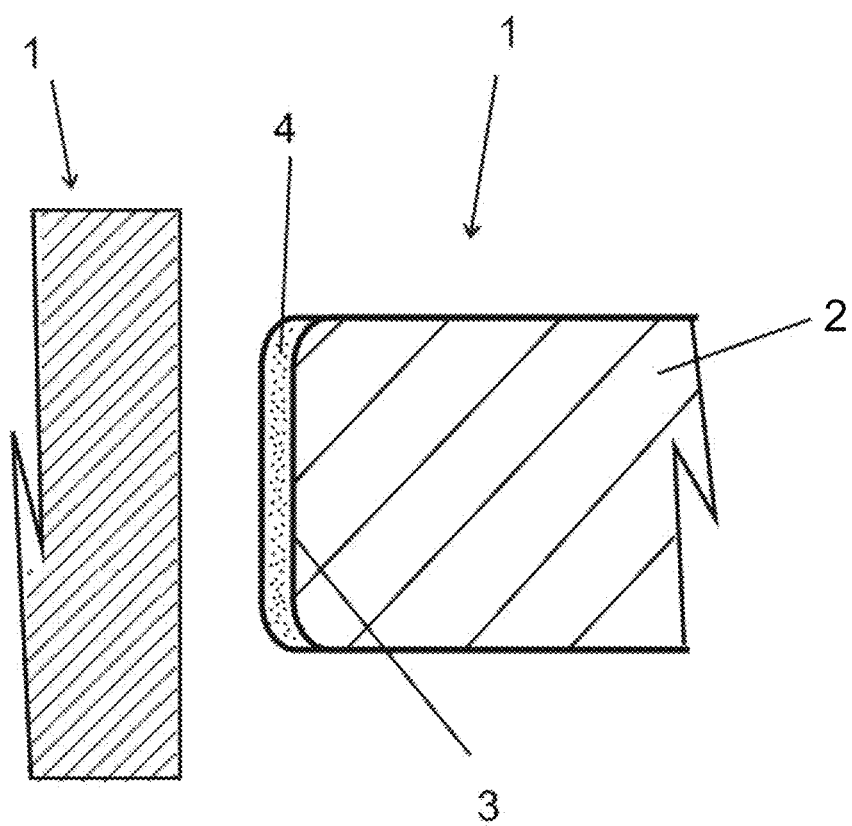
FIG. 3 is a view of two elements that work sliding, one of them being provided with a chrome-nitride coating with equiaxial morphology of the present invention.

The element 1 that works sliding of the present invention comprises a base 2 of a given metallic alloy and an outer surface 3, which will receive the coating 4 (see FIG. 3). The base 2 may be constituted by a ferrous alloy or by steel, as for example steel containing from 10 to 17% chrome (stainless steel), aluminum, among others.

Examples of elements 1 that work sliding of the present invention are found on piston rings, both compression and oil ones, cylinders and cylinder sleeves, pistons, bearings and segments, tappets and cams, among numberless others.

The coating 4 of the present invention is based on the deposition of a coating 4 on at least one surface of an element 1 that works sliding by a PVD process, more concretely through high power impulse magnetron sputtering, hereinafter called HIPIMS.

The new HIPIMS deposition method for elements 1 that work sliding enables one to ionize the material, generally a metallic material (Cr, Ti, Mo, Nb, Al, etc.), before conversion to nitride. In turn, the acceleration of the metallic ions with high energy against the coating 4 surface enables one to achieve, in a surprising manner, relaxation of the coating 4 during its growth without loss of its hardness.

It should be noted that this behavior (high hardness and low inner tensions of the coating) is not obvious, being, by the way, antagonistic with respect to the prior art. Anyway, this is a highly desired result for obtaining extraordinary resistance to wear. Upon being stressed by an outer loading (due to the application as a component of a machine or of an internal combustion engine, for example), a coating will be subjected to the generation of tensions resulting from the loading and, therefore, the lesser the initial tension of the coating the bigger the loading which it will bear, until a tension that causes rupture of the coating 4 (crack nucleation and growth thereof) is reached.

A preferred example of the present invention may is represented by FIG. 3. Supposing that the figure deals with a piston ring and a cylinder of an internal combustion engine (both elements 1 that work sliding), one can coat only one or both elements 1 that work sliding. In the present case, we will dwell on a classic example in which a piston ring, for mounting on any of its grooves, receives the coating 4 of the present invention on the surface that will contact the cylinder wall.

Preferably, but not compulsorily, the ceramic coating 4 is of chrome nitride, but other metallic elements may be used forming the ceramic coating, among which titanium, molybdenum, niobium, aluminum, etc., or a mixture thereof may be employed.

The coating 4 is deposited by the HIPIMS process with the base 2 (substrate) polarized with negative potential, and it is possible to achieve compressive inner tension values ranging from 0 to 500 MPa, but the values should preferably range from 0 to 200 MPa. The characteristic particularities of the HIPIMS deposition process enable one to achieve Vickers hardness ranging from 1000 HV to 3000 HV. It should be noted that this range is higher than the prior-art values, the value 3000 HV being surprisingly high. Additionally, the present invention manages to promote coating 4 thicknesses ranging from 5 μm to 100 μm, a value that is frankly high when compared with the prior art, so much so in the cases where the coating is based on titanium nitride, a coating that usually exhibits a limited thickness due to its high tension.

As a natural result of the high energy of the ions that form the coating 4, particularity of the HIPIMS process, there is a significant densification of the coating 4, resulting in a reduction of porosity and an excellent adhesion of the ions on the base 2. Porosity values are below 2% by volume, the preferred range for this invention being below 0.5%, a value that is really reduced with respect to the prior art when one takes into consideration that simultaneously the hardness and inner tension values are excellent.

Additionally, this process enables another advantage, enabling the growth of the coating 4 free of droplets (microparticles). As a result, the HIPIMS process for deposition of coatings 4 enables one to achieve excellent tribological properties, such as resistance to wear and to detachment.

Figure 1:
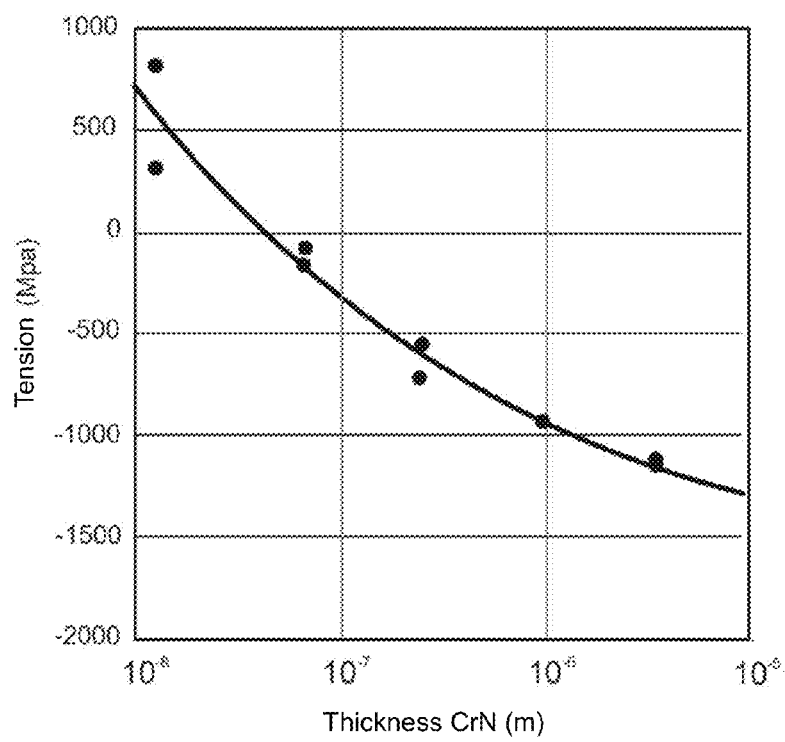
FIG. 1 is a graph that shows a relationship between the increase in compressive inner tension in a chrome-nitride coating.
Figure 2:
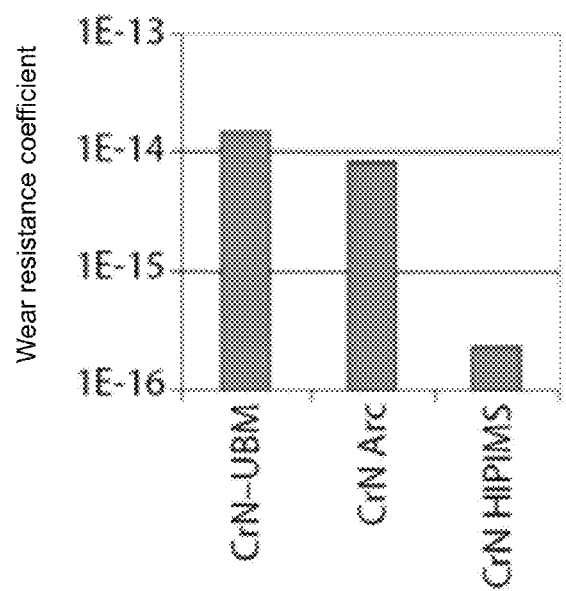
FIG. 2 is a graph that shows the wear coefficient ($m^3/Nm$) of a chrome-nitride coating as a function of different types of PVD deposition, carried out at a velocity of 10 cm/min.

The graph of FIG. 2 makes the difference of results obtained by said PVD processes clearly evident. FIG. 2 shows results of tests of the wear coefficient of a chromenitride coating as a function of different deposition methods of the prior art. One cites the deposition via sputtering of the target material with unbalanced magnetron (UBM) and Arc with respect to HIPIMS of the present invention. It is evident that the present process achieves resistance to wear more than twice as high as the prior art, without leaving margin for doubt that, in spite of being surprising, the HIPIMS coating 4 of the present invention is capable of generating very positive results for elements 1 that work sliding for use on internal combustion engines.

By virtue of the excellent results achieved, the present technology reaches the standard required for operating in the next few generations of engines, especially on engines with exhaust gas recirculation and selective catalytic reduction, thus contributing to the reduction of emission of pollutants.

Thus, it is clear that the coating 4 of the present invention proposes an unexpected relationship between the growth of a coating and its inner tension, since one manages to obtain a coating having high tribological properties and thicknesses that are not normally practiced by conventional techniques, thus generating a resistance to wear that is superior to that of any coating obtained by the PVD process of the prior art.

A preferred example of embodiment having been described, one should understand that the scope of the present invention embraces other possible variations, being limited only by the contents of the accompanying claims, which include the possible equivalents.

The invention claimed is:

1. An element provided with at least one slide surface with a coating for use on an internal combustion engine, the element comprising:
    a base of steel or cast iron; and
    at least one inner surface provided with a hard ceramic coating generated by physical vapor deposition, wherein:
        the element includes a porosity with a rate lower than 2% by volume, Vickers hardness ranging from 1500 to 3000 HV, and compressive inner tension lower than 500 MPa; and
        the physical vapor disposition is achieved by high power impulse magnetron plasma (HIPIMS), and the base is polarized with negative potential.

2. The element according to claim 1, wherein the ceramic coating comprises nitrides formed by at least one of chrome, titanium, niobium, molybdenum, or aluminum.

3. The element according to claim 1, wherein the coating includes porosity at a rate lower than 0.5 percent by volume.

4. The element according to claim 1, wherein the coating includes compressive inner tension lower than 200 MPa.

5. The element according to claim 1, wherein the coating includes a thickness ranging from 5 to 100 μm.

6. The element according to claim 1, wherein the base includes cast iron.

7. The element according to claim 1, wherein the base includes steel.

8. The element according to claim 1, wherein the base includes aluminum.

9. The element according to claim 1, wherein the element includes at least one of a piston ring, a tappet, a valve, a lob, and a bearing.

10. A coating, comprising:
    a base material having a least one ceramic slide surface disposed thereon, wherein the slide surface includes a porosity with a rate lower than 2 percent by volume, Vickers hardness ranging from 1500 to 3000 HV, and compressive inner tension lower than 500 MPA.

11. The coating according to claim 10, wherein the slide surface comprises nitrides formed by at least one of chrome, titanium, niobium, molybdenum, or aluminum.

12. The coating according to claim 10, wherein the slide surface has porosity having a rate lower than 0.5 percent by volume.

13. The coating according to claim 12, wherein the slide surface has compressive inner tension lower than 200 MPa.

14. The coating according to claim 13, wherein the slide surface comprises a thickness ranging from 5 to 100 μm.

15. The coating according to claim 10, wherein at least one of the base is polarized with negative potential and includes at least one of cast iron, steel, and aluminum.

16. A method for manufacturing an element with at least one sliding surface, comprising:
    providing a base of a metallic alloy; and
    generating a ceramic coating disposed on the base via physical vapor deposition, wherein the physical vapor deposition is achieved by high power impulse magnetron plasma sputtering;
    wherein the coating includes a porosity with a rate lower than 2 percent by volume, Vickers hardness ranging from 1500 to 3000 HV, and compressive inner tension lower than 500 MPa.

17. The method according to claim 16, wherein the coating includes a porosity having a rate lower than 0.5 percent by volume.

18. The method according to claim 16, wherein the coating includes compressive inner tension lower than 200 MPa.

19. The method according to claim 16, wherein the coating has a thickness ranging from 5 to 100 μm.

* * * * *